(12) United States Patent
Tavkhelidze et al.

(10) Patent No.: US 6,869,855 B1
(45) Date of Patent: Mar. 22, 2005

(54) METHOD FOR MAKING ELECTRODE PAIRS

(75) Inventors: Avto Tavkhelidze, Tbilisi (GE); Leri Tsakadze, Tbilisi (GE); Givi Skhiladze, Tbilisi (GE); Isaiah Watas Cox, London (GB)

(73) Assignee: Borealis Technical Limited, Gibraltar ( * ) Notice: Subject to any disclaimer, the term of this patent is extended or adjusted under 35 U.S.C. 154(b) by 0 days.

(21) Appl. No.: 10/639,908

(22) Filed: Aug. 12, 2003

Related U.S. Application Data

(60) Provisional application No. 60/403,092, filed on Aug. 12, 2002, provisional application No. 60/362,494, filed on Mar. 6, 2002, and provisional application No. 60/316,918, filed on Sep. 2, 2001.

(51) Int. Cl.⁷ .............................................. H01L 21/20
(52) U.S. Cl. ...................................... 438/380; 438/979
(58) Field of Search ................................. 438/380, 133, 438/141, 142, 328, 553, 557, 979, 983

(56) References Cited

U.S. PATENT DOCUMENTS

| | | |
|---|---|---|
| 3,740,592 A | 6/1973 | Engdahl et al. |
| 4,011,582 A | 3/1977 | Cline et al. |
| 4,063,965 A | 12/1977 | Cline et al. |
| 5,336,547 A | 8/1994 | Kawakita et al. |
| 5,883,828 A | 3/1999 | Cuchiaro et al. |
| 5,917,156 A | 6/1999 | Nobori et al. |
| 5,936,882 A | 8/1999 | Dunn |
| 6,072,718 A | 6/2000 | Abraham et al. |
| 6,211,559 B1 | 4/2001 | Zhu et al. |
| 6,214,651 B1 | 4/2001 | Cox |
| 6,225,205 B1 | 5/2001 | Kinoshita |
| 6,278,631 B1 | 8/2001 | Naji |
| 6,048,739 A1 | 4/2002 | Hurst et al. |
| 6,365,419 B1 | 4/2002 | Durlam et al. |
| 6,368,696 B1 * | 4/2002 | Asahi et al. ............. 428/195.1 |
| 6,417,060 B2 * | 7/2002 | Tavkhelidze et al. ....... 438/380 |
| 6,421,271 B1 | 7/2002 | Gogl et al. |
| 6,522,573 B2 | 2/2003 | Saito et al. |
| 6,538,297 B2 | 3/2003 | Odagawa et al. |
| 2001/0035545 A1 | 11/2001 | Schuster-Woldan et al. |
| 2001/0046749 A1 | 11/2001 | Tavkhelidze et al. |
| 2002/0039308 A1 | 4/2002 | Gogl et al. |
| 2002/0170172 A1 | 11/2002 | Tavkhelidze et al. |

FOREIGN PATENT DOCUMENTS

| | | |
|---|---|---|
| JP | 2001-217398 | 8/2001 |
| JP | 2001-357666 | 12/2001 |
| JP | 2002-157874 | 5/2002 |
| WO | WO 99/13562 A1 | 3/1999 |

OTHER PUBLICATIONS

Roy Scheuerlein, et al., "A 10ns Read and Write Non–Volatile Memory Array Using a Magnetic Tunnel Junction and FET Switch in each Cell", ISCC 2000/Session 7/TD: Emerging Memory & Device Technologies/Paper TA 7.2, 2000 IEEE International Solid–State Circuits Conference, Feb. 8, 2000, pp. 126–133.

Peter K. Naji, et al., "A 256kb 3.0V 1T1MTJ Nonvolatile Magnetoresistive RAM", ISSCC 2001/Session 7/Technology Directions: Advanced Technologies/7.6, Technology Digest, 2001 IEEE International Solid–State Circuits Conference, 11 pgs.

* cited by examiner

*Primary Examiner*—David Nhu

(57) ABSTRACT

The present invention is a method for introducing a low work function material into a pair of matched electrodes. The method involves fabricating a composite of two electrodes and a low work function material, and treating the composite so that it splits to give a pair of matched electrodes.

22 Claims, 6 Drawing Sheets

Figure 6
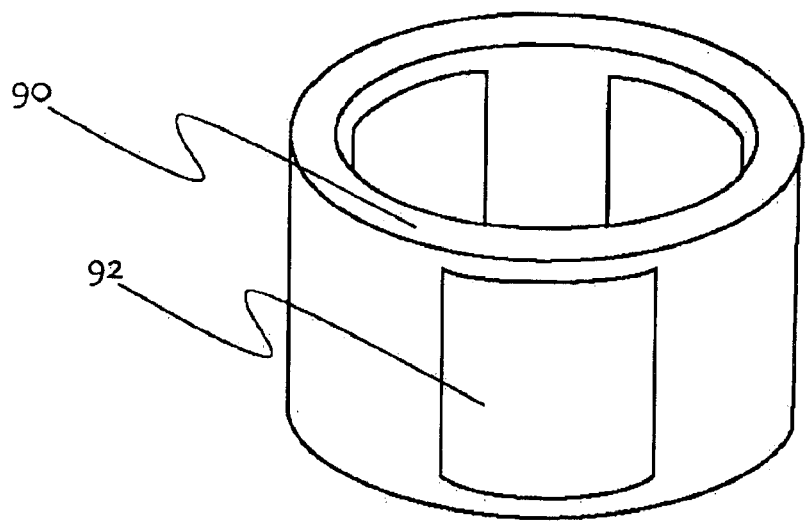
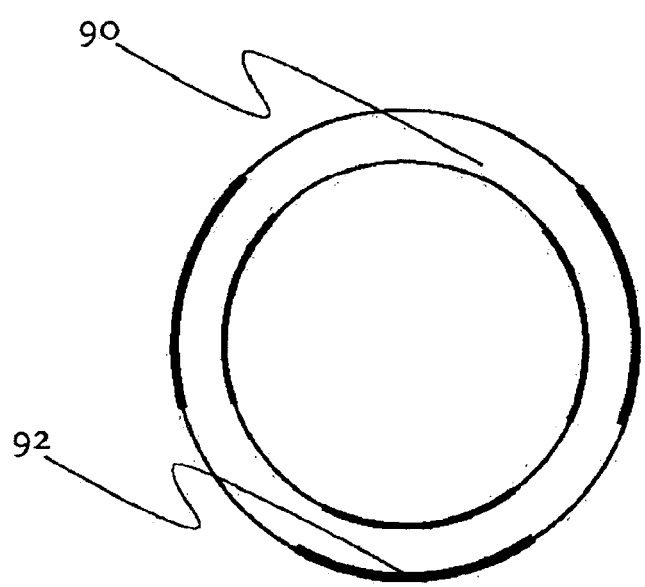

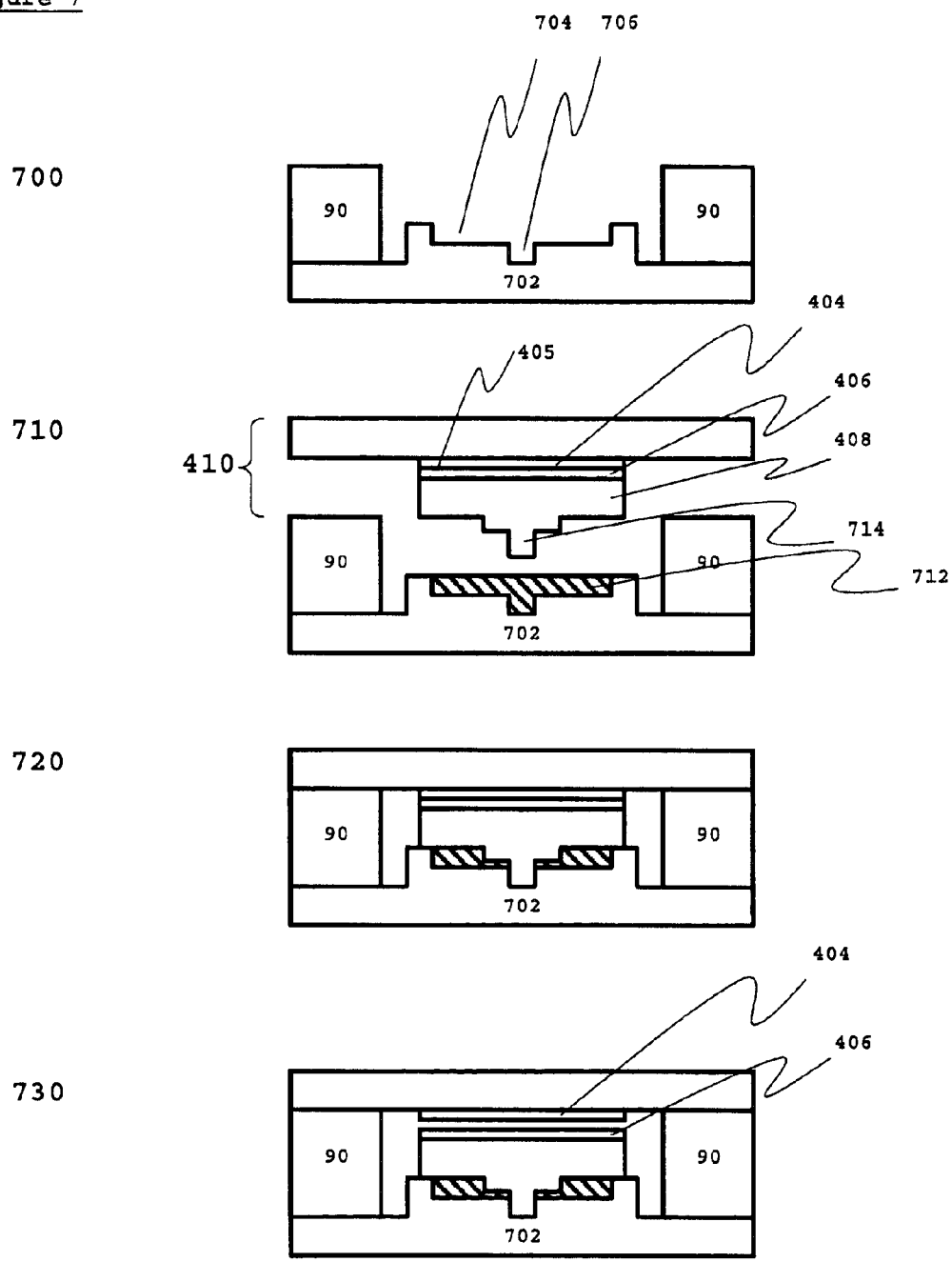

US 6,869,855 B1

METHOD FOR MAKING ELECTRODE PAIRS

CROSS-REFERENCE TO RELATED APPLICATIONS

This application claims the benefit of U.S. Provisional Application No. 60/403,092, filed 12 Aug. 2002. This application is also related to U.S. patent application Ser. No. 10/234,498, filed 2 Sep. 2002, which claims the benefit of U.S. Provisional Application No. 60/316,918, filed 2 Sep. 2001. This application is also related to PCT/US03/07015, filed 6 Mar. 2003, which claims the benefit of U.S. Provisional Application No. 60/362,494, filed 6 Mar. 2002.

BACKGROUND OF THE INVENTION

The present invention is related to methods for making a pair of electrodes that may be used in a diode device. The term diode device encompasses, for example, thermionic converters and generators, photoelectric converters and generators, and vacuum diode heat pumps. It is also related to thermotunnel converters.

WO99/13562 and U.S. Pat. No. 6,417,060 disclose methods for making pairs of electrodes whose surfaces replicate each other. The methods involve fabricating a composite by providing a first electrode with a substantially flat surface and placing a sacrificial layer over it. A second material, which will form the second electrode is placed over the sacrificial layer. The composite is then 'split' into two matching electrodes by removing the sacrificial layer by etching, by cooling the sandwich with liquid nitrogen, or by heating to evaporate the sacrificial layer.

The present invention offers a novel means for providing similarly paired electrodes in which a low work function material is introduced onto one or both of the electrode surfaces.

BRIEF SUMMARY OF THE INVENTION

The present invention is a method for introducing a low work function material into a pair of matched electrodes. In accordance with one embodiment of the present invention, the method comprises the steps of: fabricating a first electrode with a substantially flat surface; placing a layer of a low work function material over a surface of said first electrode; placing a second material over said layer of a low work function material, wherein said second material comprises a material that is suitable for use as a second electrode; and heating the composite formed to a temperature greater than the melting temperature of the low work function layer. This causes the composite to separate into a pair of matched electrodes.

In accordance with another embodiment of the present invention, the method comprises the steps of: providing a substrate having a substantially flat surface; placing a first layer over a surface of said substrate, wherein said first layer comprises a first material that is suitable for use as a first electrode; placing a second layer over said first layer, wherein said second material comprises both a material that is suitable for use as a second electrode and a low work function material, and wherein the adhesion of said second layer to said first layer is carefully controlled; placing a third layer over said second layer, wherein said third material has a thermal expansion coefficient that is different to the thermal expansion coefficient of said substrate, whereby a composite is formed; and altering the thermal environment of said composite whereby thermal stress between said substrate and said third layer is greater than the adhesion between said first layer and said second layer, causing said composite to open.

In accordance with another embodiment of the present invention, the method comprises the steps of: providing a substrate having a substantially flat surface; placing a first layer over a surface of said substrate, wherein said first layer comprises both a first material that is suitable for use as a first electrode and a low work function material; placing a second layer over said first layer, wherein said second material comprises a material that is suitable for use as a second electrode, and wherein the adhesion of said second layer to said first layer is carefully controlled; placing a third layer over said second layer, wherein said third material has a thermal expansion coefficient that is different to the thermal expansion coefficient of said substrate, whereby a composite is formed; and altering the thermal environment of said composite whereby thermal stress between said substrate and said third layer is greater than the adhesion between said first layer and said second layer, causing said composite to open.

BRIEF DESCRIPTION OF THE SEVERAL VIEWS OF THE DRAWING

For a more complete understanding of the present invention and the technical advantages thereof, reference is made to the following description taken with the accompanying drawings, in which:

FIG. 6 is a diagrammatic representation of one embodiment of a tubular housing/actuator.

FIG. 7 is a schematic showing a process for the manufacture of a diode device having a tubular housing/actuator.

DETAILED DESCRIPTION OF THE INVENTION

Definitions:

"Power Chip" is hereby defined as a device which uses a thermal gradient of any kind to create an electrical power or energy output. Power Chips may accomplish this using thermionics, thermotunneling, or other methods as described in this application.

"Cool Chip" is hereby defined as a device that uses electrical power or energy to pump heat, thereby creating, maintaining, or degrading a thermal gradient. Cool Chips may accomplish this using thermionics, thermotunneling, or other methods as described in this application.

"Gap Diode" is defined as any diode which employs a gap between the anode and the cathode, or the collector and emitter, and which causes or allows electrons to be transported between the two electrodes, across or through the gap. The gap may or may not have a vacuum between the two electrodes, though Gap Diodes specifically exclude bulk liquids or bulk solids in between the anode and cathode. The Gap Diode may be used for Power Chips or Cool Chips, for devices that are capable of operating as both Power Chips and Cool Chips, or for other diode applications.

Figure 1:
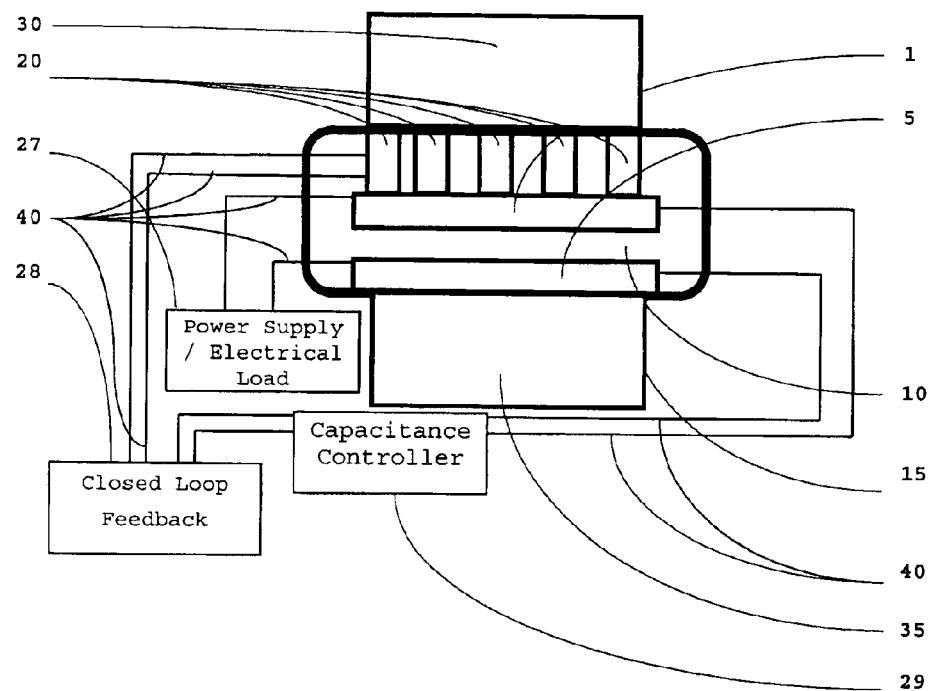
FIG. 1 is a diagrammatic representation of one embodiment of the electrode configuration of a Gap Diode, Power Chip or Cool Chip, showing piezo-electric actuators at intervals along the under-surface of an electrode.
Figure 2:
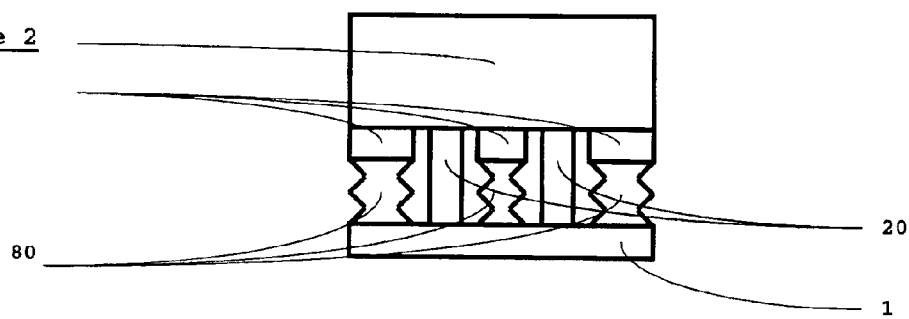
FIG. 2 is a diagrammatic representation of one embodiment of a device illustrating how heat transfer is facilitated.

The embodiments of the present invention and its technical advantages are best understood by referring to FIGS. 1–7. While in this description of the present invention specific methods are disclosed for introducing Cesium and other low work function materials into pairs of electrodes fabricated via a composite intermediate, these should not be construed as limiting the scope of the invention but as merely providing illustrations of some of the presently preferred embodiments of this invention. Similarly, although FIGS. 1 and 2 show schematics of various diode devices described in U.S. Pat. No. 6,417,060, which use actuators, preferably piezo-electric actuators, to control the separation of the electrodes, these also should not be construed as limiting the scope of the invention but as merely providing illustrations of some of the presently preferred embodiments of this invention.

Further, electrode pairs fabricated according to the methods of the present invention may be used in a number of devices, as stated herein, including, for example, (i) a device which uses a thermal gradient of any kind to generate electrical power or energy output using thermionics, thermotunneling, or other methods as described herein; (ii) a device which uses electrical power or energy to pump heat, thereby creating, maintaining, or degrading a thermal gradient using thermionics, thermotunneling, or other methods as described herein; and (iii) as any diode which employs a gap between the anode and the cathode, or the collector and emitter, and which causes or allows electrons to be transported between the two electrons, across or through the gap (with or without a vacuum in the gap). Alternatively, the device of the present invention may be integrated into or used for any ordinary diode applications.

Further, when surface features of two facing surfaces of electrodes are described as "matching," it means that where one surface has an indentation, the other surface has a protrusion and vice versa. Thus when "matched," the two surfaces are substantially equidistant from each other throughout their operating range.

Referring now to FIG. 1, two electrodes 1 and 5 are separated by a region 10 and housed in a housing 15. Electrode 1 is attached to a number of piezo-electric actuators 20 at intervals. An electric field is applied to the piezo-electric actuators via connecting wires 40 which causes them to expand or contract longitudinally, thereby altering the longitudinal distance of region 10 between electrodes 1 and 5. Electrodes 1 and 5 are connected to capacitance controller 29 which both modifies the piezo-electric actuator 20, and can give feedback to a power supply/electrical load 27 to modify the heat pumping action, and generating action, respectively. The longitudinal distance of region 10 between electrodes 1 and 5 is controlled by applying an electric field to piezo-electric actuators 20. The capacitance between emitter 1 and collector 5 is measured and controlling circuitry 29 adjusts the field applied to piezo-electric actuators 20 to hold the capacitance, and consequently the distance between the electrodes 10, at a predetermined fixed value. Alternatively, the controller 29 may be set to maximize the capacitance and thereby minimize the distance 10 between the electrodes. The diagram shown in FIG. 2 can be used as a thermionic device and/or as a tunneling device, and can be used to function as a Power Chip and/or as a Cool Chip. Capacitance controller 29 may be composed of multiple elements, and each piezo-electric actuator 20 may receive its own distinct signal, independent from the control of surrounding elements.

If it is used as a thermionic device, then electrodes 1 and 5 are made from, or are coated with, a thermionically emissive material having a work function consistent with the copious emission of electrons at the temperature of thermal interface 30. The specific work functions can be determined by calculation, or by consulting the art.

When functioning as a Cool Chip, electrons emitted from emitter 1 move across an evacuated space 10 to a collector 5, where they release their kinetic energy as thermal energy which is conducted away from collector 5 through housing 15 to thermal interface 35, which is, in this case, hotter than thermal interface 30 which the electron emission serves to cool.

When functioning as a Power Chip, electrons emitted from emitter 1 move across an evacuated space 10 to a collector 5, where they release their kinetic energy as thermal energy which is conducted away from collector 5 through housing 15 to thermal interface 35, and a current is generated for electrical load 27. The feedback loop from the capacitance controller 29 to the piezo-electric actuators 20 allows for the device to adjust for varying conditions, including vibration, shock, and thermal expansion.

When functioning as a tunneling Gap Diode, as one side of the device becomes hot and its components expand, the distance between the electrodes can be maintained at a fixed distance with the feedback loop between capacitance controller 29 and piezo-electric actuators 20. Provided the surface of emitter 1 and collector 5 are made sufficiently smooth (or, as discussed below, matching one another) that emitter 1 may be moved into such close proximity to collector 5 that quantum tunneling between the electrodes occurs. As mentioned above, this device can be used as a Gap Diode, a Power Chip, or a Cool Chip. Under these conditions, it is not necessary that region 10 should be evacuated. When the gap distance between the electrodes is less than the free mean path of an electron of the gas, i.e. in the order of tens of angstroms, thermal conduction through the gas is considerably lessened. In all tunneling embodiments disclosed in this application, this advantage is noted, especially for applications where thermal conduction is a concern, such as Power Chips and Cool Chips. Hence the region 10 is in some embodiments filled with an inert gas.

When functioning as a diode which is not designed to facilitate heat flow, thermal interface 30 and thermal interface 35, are not necessary, and the resulting device could be integrated into, and used for ordinary diode applications.

It is to be understood that the term "evacuated" signifies the substantial removal of the atmosphere between the electrodes, but does not preclude the presence of atoms such as cesium.

Referring now to FIG. 2, which shows a preferred embodiment for facilitating heat transfer between a thermal interface 30 and an electrode 1, corrugated tubes 80, preferably fabricated from stainless steel, and form part of the structure between electrode 1 and thermal interface 30. These tubes may be positioned with many variations, and act to allow for the movement of the positioning elements 20 and of the electrode 1 whilst maintaining support, or containment, etc., for the device, by being able to be stretched and/or compressed longitudinally. In some embodiments, corrugated tubes 80 may form the walls of a depository of a metal powder 82, preferably aluminum powder with a grain size of 3–5 microns. More metal powder 82 would be used to receive heat transferred to the collector electrode 1, but the surroundings of the metal powder would be made smaller as the positioning elements 20 would cause the electrode 1 to move toward the thermal interface 30. Hence the use of an expandable depository, made from corrugated tubing 80. Corrugated tubes 80 may also enclose the entire device, to allow for movement, as well as individual piezo-electric actuators 20.

As disclosed in the foregoing, actuator elements facilitate the close positioning of the electrodes, and if the electrode pairs are matched, then it is possible to move them into sufficiently close proximity to allow tunneling to occur. WO99/13562 and U.S. Pat. No. 6,417,060 disclose methods for making pairs of electrodes whose surfaces are so matched. The present invention further improves on these processes, and allows for the introduction of low work function materials during the fabrication of the composite intermediate, or directly afterwards.

Figure 3:
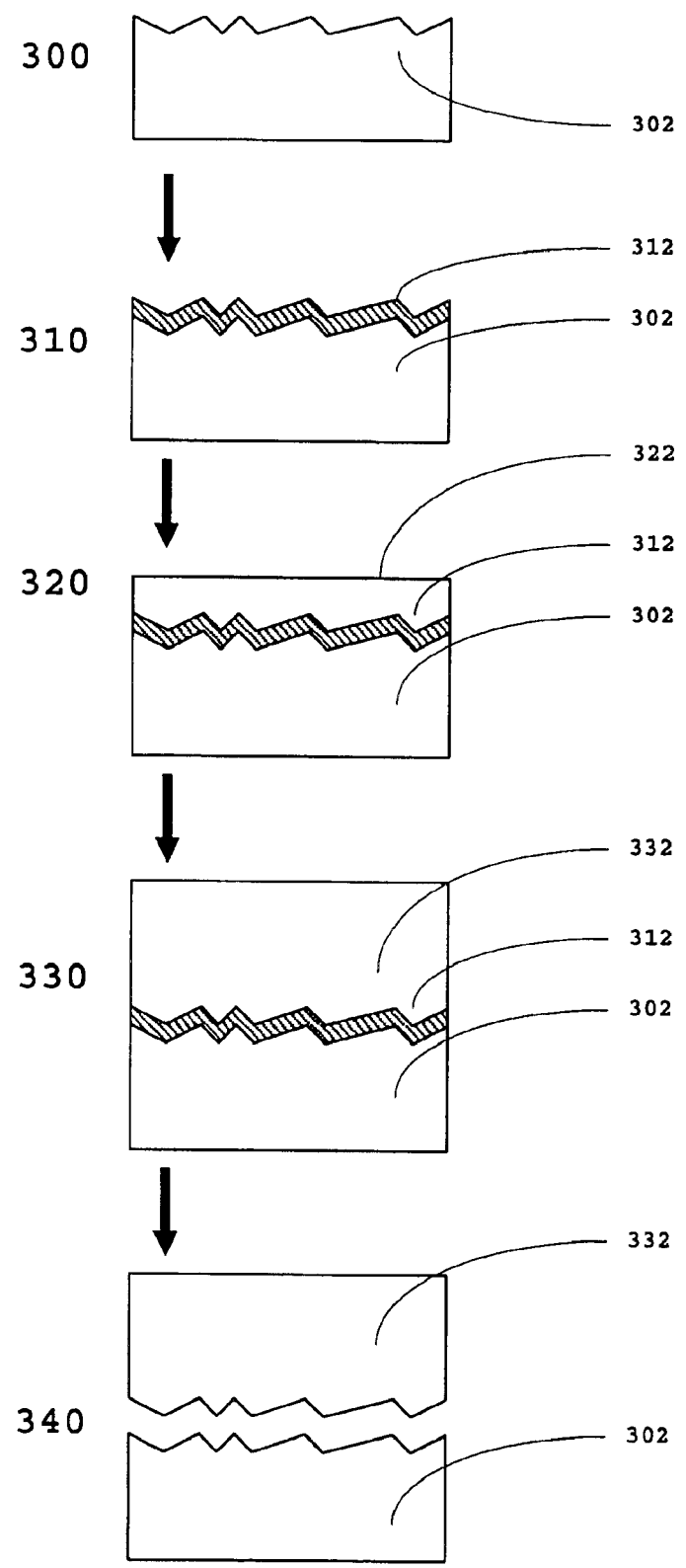
FIG. 3 is a schematic showing a process for the manufacture of pairs of electrodes that have approximately matching surface details.

The method of the present invention may be understood by referring to FIG. 3, which describes in schematic form a method for producing pairs of electrodes having substantially smooth surfaces in which any topographical features in one are matched in the other. The method involves a first step 300 in which a polished monocrystal of material 302 is provided. In the finished electrode pair, this will form one of the electrodes. Material 302 may be polished tungsten, or other materials. In a step 310 a thin layer 312 of a second material, is deposited onto the surface of the material 302. This layer is sufficiently thin so that the shape of the polished surface 302 is repeated with high accuracy. This second material is a low work function material such as cesium, and will typically have a thickness in the 2–20 nm range. To avoid oxidization of the cesium during the process of electrochemical growth of Cu the edge of the film is protected against contact with atmosphere. A thin layer 322 of a third material is deposited on layer 312 in a step 320, and in a step 330 another layer is grown electrochemically to form a layer 332. In the finished electrode pair, this will form the second electrode. In a step 340 the composite formed in steps 300 to 330 is heated up to a temperature greater than the melting temperature of layer 312 but which is lower than the melting temperature of layers 302 and 332. When layer 322 is cesium, which has a melting temperature of about 30° C., the sandwich will open easily. For example heating the composite to 35° C. will open it without introducing appreciable tension in the electrodes.

Figure 4:
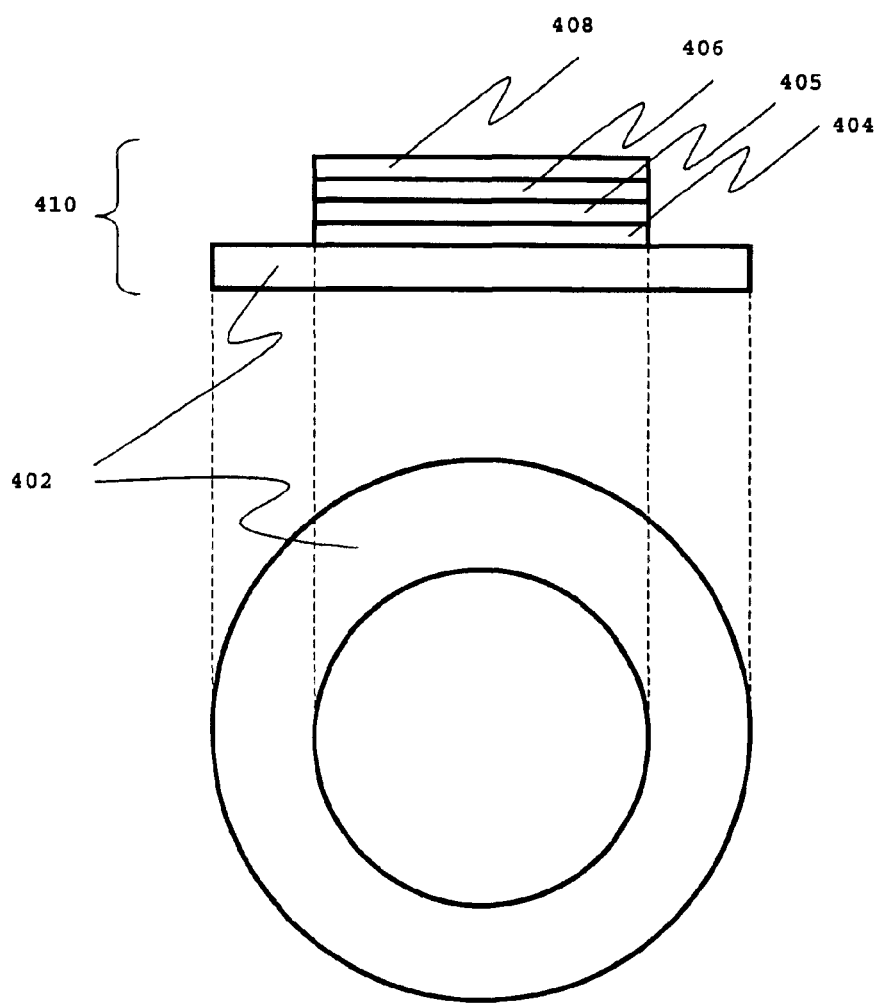
FIG. 4 is a diagrammatic representation of an electrode composite on a silicon wafer.

The method of the present invention may be further understood by referring to FIG. 4, in which a layer of titanium 404 is deposited on substrate 402, and a layer of a low work function material 405 is deposited on the layer of titanium. The low work function material may be cesium, and typically the layer has a thickness in the 2–20 nm range. A layer of silver 406 is further deposited on the layer of cesium. A further layer of copper 408 is grown electrochemically on the layer of silver. To avoid oxidization of the cesium, during the process of electrochemical growth of Cu the edge of the film is protected against contact with atmosphere and the silver paste or liquid metal. In a similar fashion to the process described above and in FIG. 3, the composite 410 shown in FIG. 4 is heated up to a temperature greater than the melting temperature of layer 405 but which is lower than the melting temperature of the other layers. When layer 405 is cesium, which has a melting temperature of about 30° C., the sandwich will open easily. For example heating the composite to 35° C. will open it without introducing appreciable tension in the electrodes.

In a further aspect, the low work function material may be deposited onto electrode material 404 at the same time as the electrode material 406 so that the low work function material becomes embedded in the electrode material (in this case, layers 405 and 406 in FIG. 4 form one layer). The work function of this 'compound' electrode material may be adjusted to a desired value by selecting the amount of the low work function material to be added.

In a further aspect, the low work function material may be deposited onto substrate 402 at the same time as the electrode material 404 so that the low work function material becomes embedded in the electrode material (in this case, layers 404 and 405 in FIG. 4 form one layer). The work function of this 'compound' electrode material may be adjusted to a desired value by selecting the amount of the low work function material to be added.

The processes described in FIGS. 3 and 4 produce two electrodes whose surfaces replicate each other, and in which one or both of the electrodes is coated with a low work function material, such as cesium. This means that they may be positioned in very close proximity, as is required, for example, for the thermotunnel Power Chip and Cool Chip. In a variation of the methods shown in FIGS. 3 and 4, piezo-electric actuators 20 may be attached to one or both of the electrodes and used to draw the two apart as the intervening layer melts. This ensures that the two electrodes are then in the correct orientation to be moved back into close juxtaposition to each other by the piezo-electric actuators. The gap may be as described above, for example less than 50 nanometers, less than 100 angstroms, or less than 50 angstroms in distance.

Figure 5:
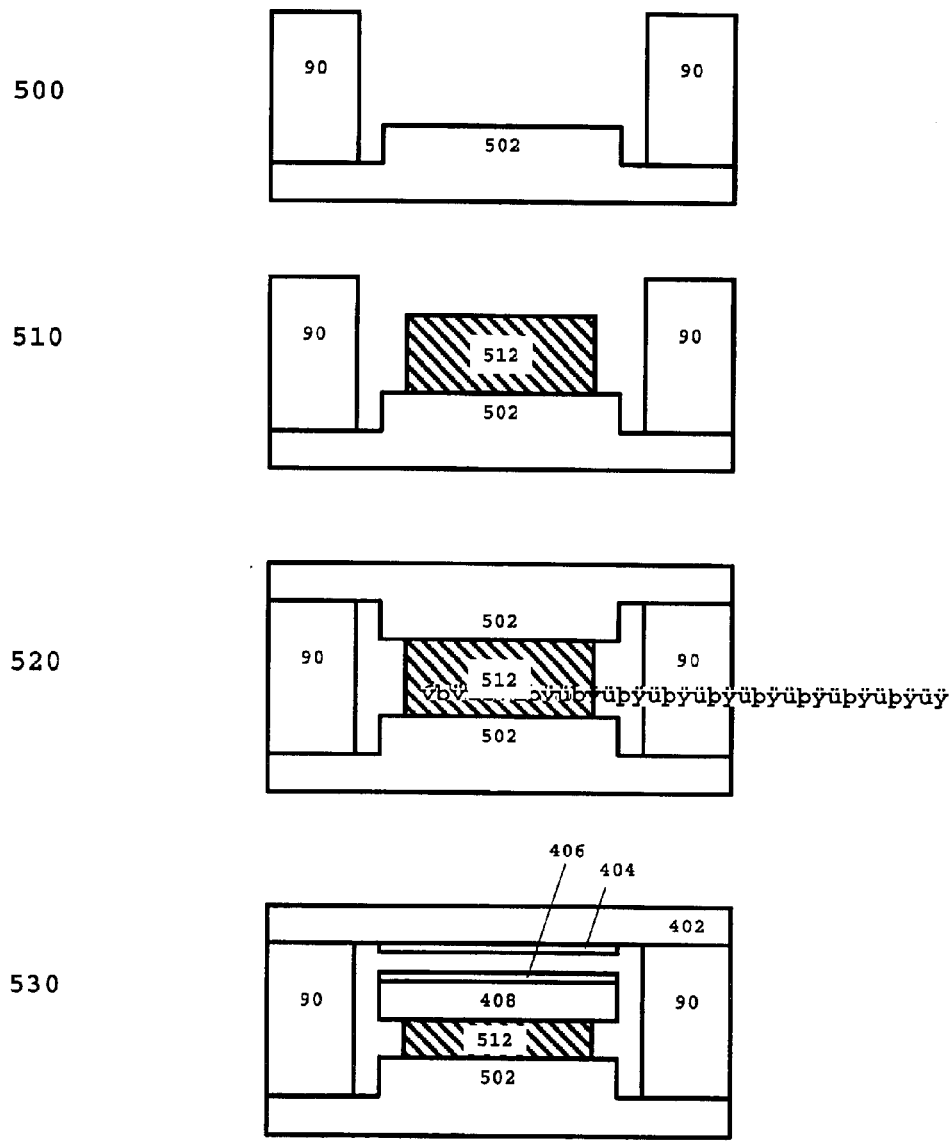
FIG. 5 is a schematic showing a process for the manufacture of a diode device having a tubular housing/actuator.

Utilization of actuators in this fashion may be better understood by referring to FIG. 5, in which in step 500 a first composite 502 (which may be the composite shown in step 130 of FIG. 3 or the composite 410 shown in FIG. 4) is brought into contact with a polished end of a quartz tube 90 of the sort shown in FIG. 6; here, a tubular actuating element 90 has pairs of electrodes 92 disposed on its inner and outer surfaces for controlling the dimensions of the tubular element. FIG. 6 shows three such electrode pairs; fewer or more of such pairs may be present to control the dimensions of the tubular element. Most preferably substrate 502 comprises a silicon wafer, and is polished at least around its periphery where it is in contact with tube 90. In step 510, an electrically conducting paste 512, preferably silver paste, is applied to the upper surface of the lower composite, as shown. Where the composite is the composite depicted in FIG. 4, the conducting paste is applied to the electrochemically grown layer of copper 408. In step 520, the polished silicon periphery or the upper composite 502 is contacted with the other polished end of the quartz tube 90; at the same time, the electrically-conducting paste, preferably silver paste or liquid metal, contacts the upper composite as shown. High pressure is applied to this assemblage, which accelerates the chemical reaction between the polished silicon periphery of the composites and the polished ends of the quartz tube, bonding the polished surfaces to form the assemblage depicted in step 520. In step 530, the assemblage is heated, which causes the composite to open as shown, forming two electrodes, 404 and 406. Cesium has a melting temperature of about 30° C. and so the sandwich will open very easily. Cesium layer 405 now forms a coating on electrode 404. For example heating the composite to 35° C. will open it without introducing appreciable tension in the electrodes. In FIG. 5, upper composite 502 does riot have the cesium layer, and so does not 'open' like the lower composite. In a further embodiment, composite 502 shown in FIG. 5 may comprise Molybdenum of the same shape and dimensions as the upper composite. This metal has a similar thermal expansion coefficient as quartz and can be bonded to quartz.

In a further aspect, the low work function material is not part of composite 502, but is introduced after the sandwich is opened. Referring again to FIG. 4, a preferred way of achieving this is as follows: layer 405 is a film of silver deposited on the layer of titanium 404, and a second film of titanium 406 is further deposited on the film of silver 405. An oxidation step leads to the formation of a Ti/Ag$_2$O/Ti composite. A further film of silver is deposited on the titanium 406 (not shown in FIG. 4), and a layer of copper 408 is grown electrochemically on the layer of silver as described above. The sandwich is opened inside the assembly as shown in step 530 of FIG. 5, oxygen is introduced and the Ag/Cu cathode is oxidized to give Ag$_2$O$_3$/Cu, and the anode surface Ti is oxidized to give TiO$_2$. Cs wire is mounted inside the quartz housing 90 and is evaporated in situ to form a low work function Ag$_2$O$_3$/Cs film.

Referring now to FIG. 7, which depicts a further schematic process for utilization of actuators in the process of the invention, in step 700 a first substrate 702 is brought into contact with a polished end of a quartz tube 90 of the sort shown in FIG. 7. Substrate 702 is any material which may be bonded to quartz, and which has a similar thermal expansion coefficient to quartz. Preferably substrate 702 is molybdenum, or silicon doped to render at least a portion of it electrically conductive. Substrate 702 has a depression 704 across part of its surface. Substrate 702 also has a locating hole 706 in its surface. In step 710, liquid metal 712, is introduced into depression 702. The liquid metal is a metal having a low vapor pressure, and which is liquid under the conditions of operation of the device. The low vapor pressure ensures that the vapor from the liquid does not degrade the vacuum within the finished device. Preferably the liquid metal is a mixture of Indium and Gallium. Composite 410 is positioned so that alignment pin 714 is positioned above locating hole 706. Composite 410 is preferably the composite depicted in FIG. 4, in which a layer of titanium 404 is deposited on substrate 402, and a layer of cesium 405 is deposited on the layer of titanium. The cesium layer has a thickness in the 2–20 nm range. A layer of silver 406 is further deposited on the layer of cesium. A further layer of copper 408 is grown electrochemically on the layer of silver. To avoid oxidization of the cesium, during the process of electrochemical growth of Cu the edge of the film is protected against contact with atmosphere and the silver paste or liquid metal. Alignment pin 714, which is pre-machined, is placed on the composite near the end of the electrolytic growth phase; this results in its attachment to the layer of copper 408. The diameter of the alignment pin is the same as the diameter of the locating hole. In step 720, the polished silicon periphery of the composite 702 is contacted with the other polished end of a quartz tube 90 of the type shown in FIG. 5; at the same time, the attachment pin seats in locating hole. During this step, substrate 702 is heated so that locating hole expands; when the assemblage is subsequently cooled, there is a tight fit between the alignment pin and the locating hole. High pressure is applied to this assemblage, which accelerates the chemical reaction between the polished silicon periphery of the composites and the polished ends of the quartz tube, bonding the polished surfaces to form the assemblage depicted in step 720. In step 730, the assemblage is heated, and a signal applied to the quartz tube to cause the composite to open as shown, forming two electrodes, 404 and 406. Cesium has a melting temperature of about 30° C. and so the sandwich will open very easily. For example heating the composite to 35° C. will open it without introducing appreciable tension in the electrodes, so that when the electrode composite/quartz tube shown in FIG. 7 is heated, the electrode composite opens as shown. Cesium layer 405 now forms a coating on electrode 404. During the opening process, the tight fit between the alignment pin and the locating hole ensures that the electrodes 404 and 406 do not slide relative to one another.

In a further aspect, the low work function material is not part of composite 410, but is introduced after the sandwich is opened. According to this embodiment, composite 410 comprises a film 405 of silver deposited on the layer of titanium 404, and a second film of titanium 406 further deposited on the film of silver 405. An oxidation step leads to the formation of a Ti/Ag$_2$O/Ti composite. A further film of silver is deposited on the titanium 406 (not shown in FIG. 7), and a layer of copper 408 is grown electrochemically on the layer of silver as described above. The sandwich is opened inside the assembly as shown in step 730, oxygen is introduced and the Ag/Cu cathode is oxidized to give Ag$_2$O$_3$/Cu, and the anode surface Ti is oxidized to give TiO$_2$. Cs wire is mounted inside the quartz housing 90 (not shown) and is evaporated in situ to form a low work function Ag$_2$O$_3$/Cs film.

Although the above specification contains many specificities, these should not be construed as limiting the scope of the invention but as merely providing illustrations of some of the presently preferred embodiments of this invention.

While this invention has been described with reference to numerous embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains.

What is claimed is:

1. A method for manufacturing a pair of electrodes, said method comprising the steps of:
    a) providing a substrate having a substantially flat surface;
    b) placing a first layer over a surface of said substrate, wherein said first layer comprises a first material that is suitable for use as a first electrode;
    c) placing a second layer over said first layer, wherein said second layer comprises a material that is suitable for use as a second electrode;
    d) placing a third layer over said second layer, wherein said third material has a thermal expansion coefficient that is different to the thermal expansion coefficient of said substrate, whereby a composite is formed;
    e) enclosing said composite in a housing;
    f) introducing a low work function material into a region enclosed by said housing;
    g) altering a thermal environment of said composite, causing said composite to open between said first and second electrode; and
    h) further altering the thermal environment within said housing, causing said low work function material to vaporize into a space formed between said first and said second electrode.

2. The method of claim 1, wherein said first material comprises titanium.

3. The method of claim 1, wherein said low work function material comprises Cs or Ba.

4. The method of claim 1, wherein said second material comprises silver.

5. The method of claim 1, wherein said third material comprises copper or brass.

6. The method of claim 1, wherein said substrate comprises silicon.

7. The method of claim 1, wherein said step of placing a third material comprises growing electrochemically.

8. The method of claim 1 wherein said step of placing a first layer comprises:

(a) placing a layer of titanium over said substrate;

(b) placing a layer of silver over said layer of titanium;

(c) placing a layer of titanium over said layer of silver; and (d) oxidizing said layer of silver.

9. The method of claim 1 additionally comprising the step of: oxidizing said second layer prior to causing said low work function material to vaporize.

10. The method of claim 1, additionally comprising the step of: evacuating said housing area to remove oxygen and moisture prior to causing said low work function material to vaporize.

11. The method of claim 1, further comprising the steps of:

a) attaching said first electrode and said second electrode to an actuator; and b) using said actuator to maintain a region between said first and second electrodes, wherein topographical features on the surface of said first electrode are maintained in spatial orientation with a matching topographical feature on said second electrode.

12. A method for manufacturing a pair of electrodes, said method comprising the steps of:

a) providing a substrate having a substantially flat surface;

b) placing a first layer over a surface of said substrate, wherein said first layer comprises a first material that is suitable for use as a first electrode;

c) placing a layer of a low work function material over said first layer;

d) placing a second layer over said low work function material, wherein said second layer comprises a material that is suitable for use as a second electrode;

e) placing a third layer over said second layer, whereby a composite is formed; and f) enclosing said composite in a housing; and g) heating said composite to a temperature greater than the melting temperature of said second layer but which is lower than the melting temperature of the other layers, causing said low work function material to vaporize into a space formed between said first and second electrode.

13. The method of claim 12 wherein said steps (b) and (c) are combined into a single step comprising: placing a first layer over a surface of said substrate, wherein said first layer comprises both a first material that is suitable for use as a first electrode and a low work function material.

14. The method of claim 12 wherein said steps (c) and (d) are combined into a single step comprising: placing a second layer over said first layer, wherein said second material comprises both a material that is suitable for use as a second electrode and a low work function material.

15. The method of claim 12 wherein said step of placing a first layer comprises:

(a) placing a layer of titanium over said substrate;

(b) placing a layer of silver over said layer of titanium;

(c) placing a layer of titanium over said layer of silver; and (d) oxidizing said layer of silver.

16. The method of claim 1 wherein step g) is performed before step f).

17. The method of claim 16 wherein said first material is titanium, said second material is silver, and said third material is copper and additionally comprising the step of introducing oxygen and oxidizing said Ag/Cu cathode to $Ag_2O_3$/Cu, and oxidizing said Ti anode to $TiO_2$.

18. The method of claim 1, wherein said low work function material comprises cesium, and said step of heating said composite comprises heating said composite to a temperature of 30° C. or more.

19. The method of claim 1, wherein said low work function material comprises cesium, and said step of heating said composite comprises heating said composite to a temperature of about 35° C.

20. The method of claim 1, wherein said layer of low work function material has a thickness in the range 2–20 nm.

21. The method of claim 12 additionally comprising protecting an edge region of said low work function material from oxidizing, said protecting step comprising coating said edge region with a protecting agent.

22. The method of claim 21 wherein said protecting agent is selected from the group consisting of silver paste and liquid metal.

* * * * *